(12) United States Patent
Ohira et al.

(10) Patent No.: US 6,403,410 B1
(45) Date of Patent: Jun. 11, 2002

(54) PLASMA DOPING SYSTEM AND PLASMA DOPING METHOD

(75) Inventors: Kouichi Ohira; Bunya Matsui; Kazuo Maeda, all of Tokyo (JP)

(73) Assignees: Canon Sales Co., Inc.; Semiconductor Process Laboratory Co., Ltd., both of (JP)

( * ) Notice: Subject to any disclaimer, the term of this patent is extended or adjusted under 35 U.S.C. 154(b) by 0 days.

(21) Appl. No.: 09/431,073

(22) Filed: Nov. 1, 1999

(30) Foreign Application Priority Data

May 14, 1999 (JP) .......................... 11-133869

(51) Int. Cl.[7] ........................................... H01L 21/338
(52) U.S. Cl. ...................... 438/181; 257/458; 136/249
(58) Field of Search ................................ 438/513, 485, 438/96; 136/249

(56) References Cited

U.S. PATENT DOCUMENTS 5,589,007 A * 12/1996 Fujioka ...................... 136/249

FOREIGN PATENT DOCUMENTS

| EP | 0 489 407 A2 | 6/1992 |
| EP | 0 665 307 A2 | 8/1995 |
| JP | 2278720 | 11/1990 |
| JP | 516656 | 3/1993 |
| JP | 661161 | 3/1994 |
| WO | WO 92/14258 | 8/1992 |

OTHER PUBLICATIONS

Mizuno et al, Plasma Doping, 52$^{nd}$ Semiconductor and IC Symposium, 6–12 & 6–13–97.

* cited by examiner

Primary Examiner—John F. Niebling
Assistant Examiner—Andre C Stevenson
(74) Attorney, Agent, or Firm—Lorusso & Loud

(57) ABSTRACT

The present invention relates to a plasma doping system capable of handling larger-diameter wafers and of introducing impurities to a shallow depth with a lower energy level. The plasma doping system includes a plasma generation chamber provided with a high-frequency power source and with antennas for generating a helicon plasma of a gas containing conduction type impurities. An impurity introduction chamber is provided with a substrate holding fixture. A plasma flow passage/shaping chamber provides a flow passage through which the helicon plasma flows from the plasma generation chamber to the impurity introduction chamber and has a magnetic field generator for generating a magnetic field to constrict the helicon plasma flowing therethrough.

12 Claims, 7 Drawing Sheets

Center

PLASMA DOPING SYSTEM AND PLASMA DOPING METHOD

BACKGROUND OF THE INVENTION

1. Field of the Invention

The present invention relates to a plasma doping system and a plasma doping method capable of dealing with larger-diameter wafers and of introducing impurities to a shallow depth with a lower energy level.

2. Description of the Related Art

In recent fabrication of ultra-high density semiconductor IC devices, one of the essential techniques which determines the main characteristics of transistors or other components is an impurity introduction technique for introducing conduction imparting type impurities (hereinafter, may be referred to simply as "impurities") into semiconductor substrates. It is indispensable for the impurity introduction technique to provide a high accuracy control of the dose of impurities or to form high density and very shallow impurity introduction regions. Note that the conduction imparting type impurities when introduced into a semiconductor layer serve to produce conductive p-type or n-type regions in the semiconductor layer, i.e., introduction region, as well as to vary the resistance value of the introduction region.

Conventional impurity introduction methods include a thermal diffusion method and an ion implantation method. Due to its accurate control of dosage, the ion implantation method is particularly advantageous. e.g., to control the threshold value of MOS FETs (Metal-Oxide-Semiconductor field effect transistors).

In the field of impurity introduction for forming high density and extremely shallow impurity introduction regions, particular attention has recently been given to a plasma doping method, in preference to the thermal diffusion method and the ion implantation method, since it is suitable for application to large diameter wafers.

The plasma doping method ensures a high throughput for the large diameter wafers and allows introduction of impurities at a low energy level, e.g., at room temperature.

Plasma doping systems for effecting such a plasma doping method are known from Japanese Patent Laid-open Pub. Nos. Hei 2-278720, Hei 5-16656, Hei 6-61161, etc.

Japanese Patent Laid-open Pub. No. Hei 5-16656 discloses an apparatus in which impurity gas plasma is generated between a pair of parallel plate electrodes to thereby perform the introduction of impurities. Japanese Patent Laid-open Pub. Nos. Hei 2-278720 and Hei 6-61161 disclose apparatuses in which an impurity gas plasma is generated by an ECR (Electron Cyclotron Resonance) method to thereby effect the introduction of impurities.

A plasma doping method using an ECR/RF plasma source is also disclosed in Semiconductor Integrated Circuit Technology 52th Symposium Transaction, pp. 165 to 170. June 1997. In this method, an He based $B_2H_6$ (diborane) gas is transformed into plasma for the introduction of boron into silicon substrates, after which RTA (Rapid Thermal Annealing) is carried out to form p-type diffusion regions having a surface density of approx. $1 \times 10^{21}$ cm$^{-3}$ and a depth of 50 nm.

In the case of selective introduction of impurities into the silicon substrate by use of the plasma doping method, it is necessary to form a resist film having openings corresponding to the impurity introduction regions so as to allow the impurities to be introduced through the openings of the resist film into the silicon substrate, and to thereafter remove the resist film, prior to annealing for the activation of the impurities.

With the increasing wafer diameters however, the conventional plasma doping apparatus using the ECR method has to be provided with an enlarged plasma generation chamber and impurity introduction chamber and with an enhanced power supply. For this reason, the overall dimensions of the system are increased including the ECR plasma source, i.e., a wave guide for microwaves, electromagnets and a matching unit, resulting in an increase in the floor area required for the placement of the plasma doping system itself.

In view of the system as a whole required for the introduction of impurities, there is a need for an ashing apparatus to remove the resist film acting as a mask and for an annealer, which necessitate a further increase in floor area for the placement of the system.

SUMMARY OF THE INVENTION

It is therefore the object of the present invention to provide a plasma doping system and a plasma doping method using the system, capable of reducing the floor areas required for the placement of the plasma doping system itself or or the placement of a plurality of apparatuses for a series of process steps attendant to the plasma doping.

The plasma doping system of the present invention is provided with a high-frequency power source for generating a helicon plasma of a gas containing conduction type impurities and antennas for discharging the high-frequency electric power.

In the case of larger wafer diameters, it is necessary for a plasma doping system using the ECR method for the generation of plasma to have a power source providing a frequency as high as 2.45 GHz or to enlarge the matching unit or the wave guides. In addition, the electromagnets for generating ECR must also be increased in size.

On the contrary, the system of the present invention allows use of a lower frequency, as low as 13.56 MHz, for the high-frequency power source, thereby eliminating the need to increase the size of the high frequency power source to a large extent. Due to the simple structure, the antennas need not be much enlarged either. Compact permanent magnets can be used as the magnetic field generation means disposed in the plasma flow passage/shaping thereby minimizing the size.

It is therefore possible for the doping system using the helicon plasma in accordance with the present invention to reduce the required floor area, as compared with the conventional doping system using the ECR plasma.

Furthermore, a single transfer chamber provides communication among the impurity introduction chamber, the ashing chamber and the annealing chamber of the plasma doping system, whereby a single system can perform a series of process steps attendant to the plasma doping such as introduction of conduction type impurities, removal of the resist mask for the selective introduction of the conduction type impurities and activation of the conduction type impurities.

Where separate apparatuses are used for different steps and individually placed, each apparatus requires a working space for the workers in addition to the floor area for the apparatus itself. Those apparatuses may be integrated into a single system such that conveyance robots carry the semiconductor substrate between the different chambers of the system, thereby achieving a reduction in the working space thereof. It is therefore possible to reduce the floor area necessary for the placement of the system in its entirety, as compared with the case of individual placement of each apparatus.

DESCRIPTION OF THE PREFERRED EMBODIMENTS

The present invention will now be described with reference to the accompanying drawings which illustrate preferred embodiments of the present invention in a non-limitative manner.

Figure 1:
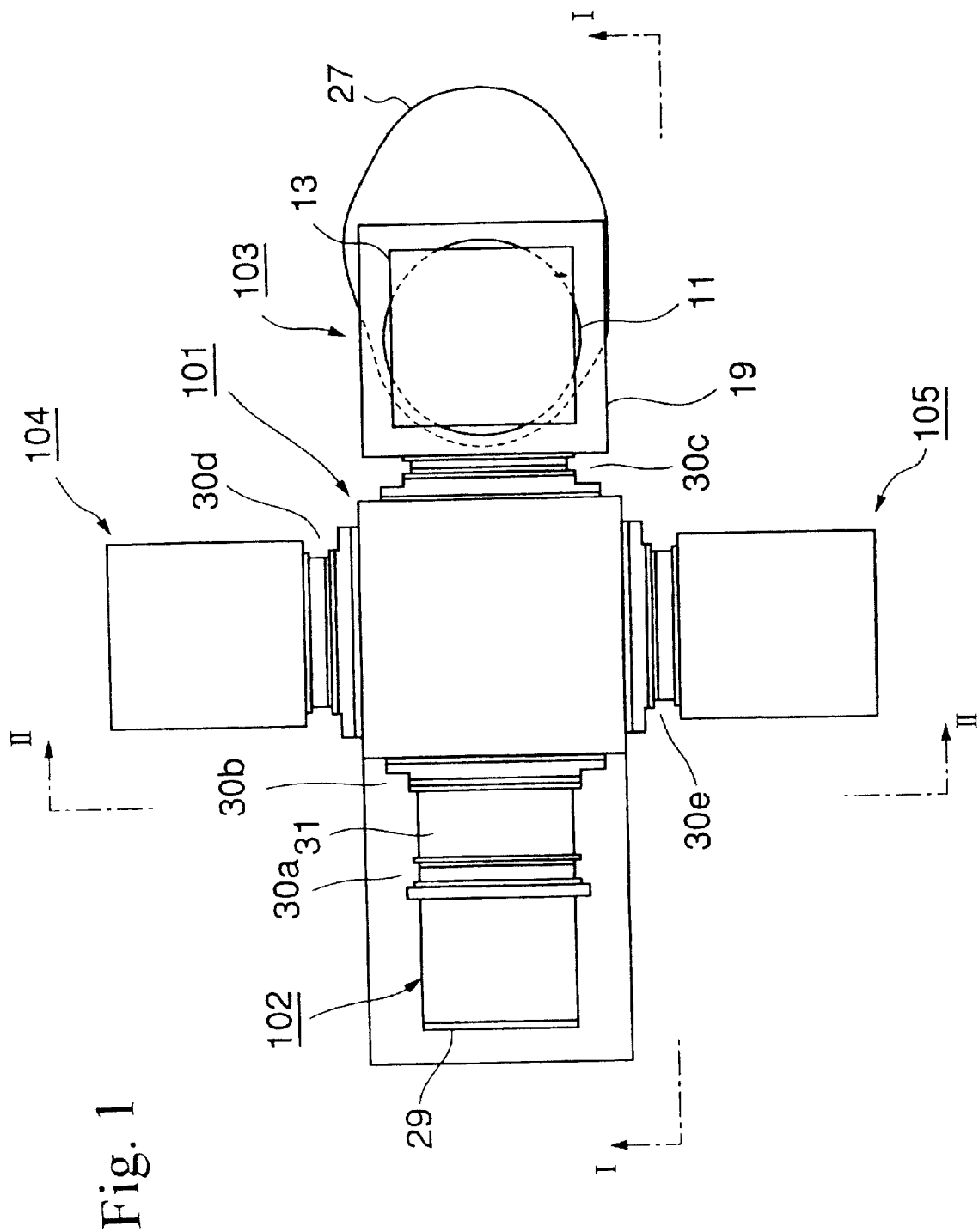
FIG. 1 is a top plan view showing the configuration of a plasma doping system in accordance with an embodiment of the present invention.
Figure 2:
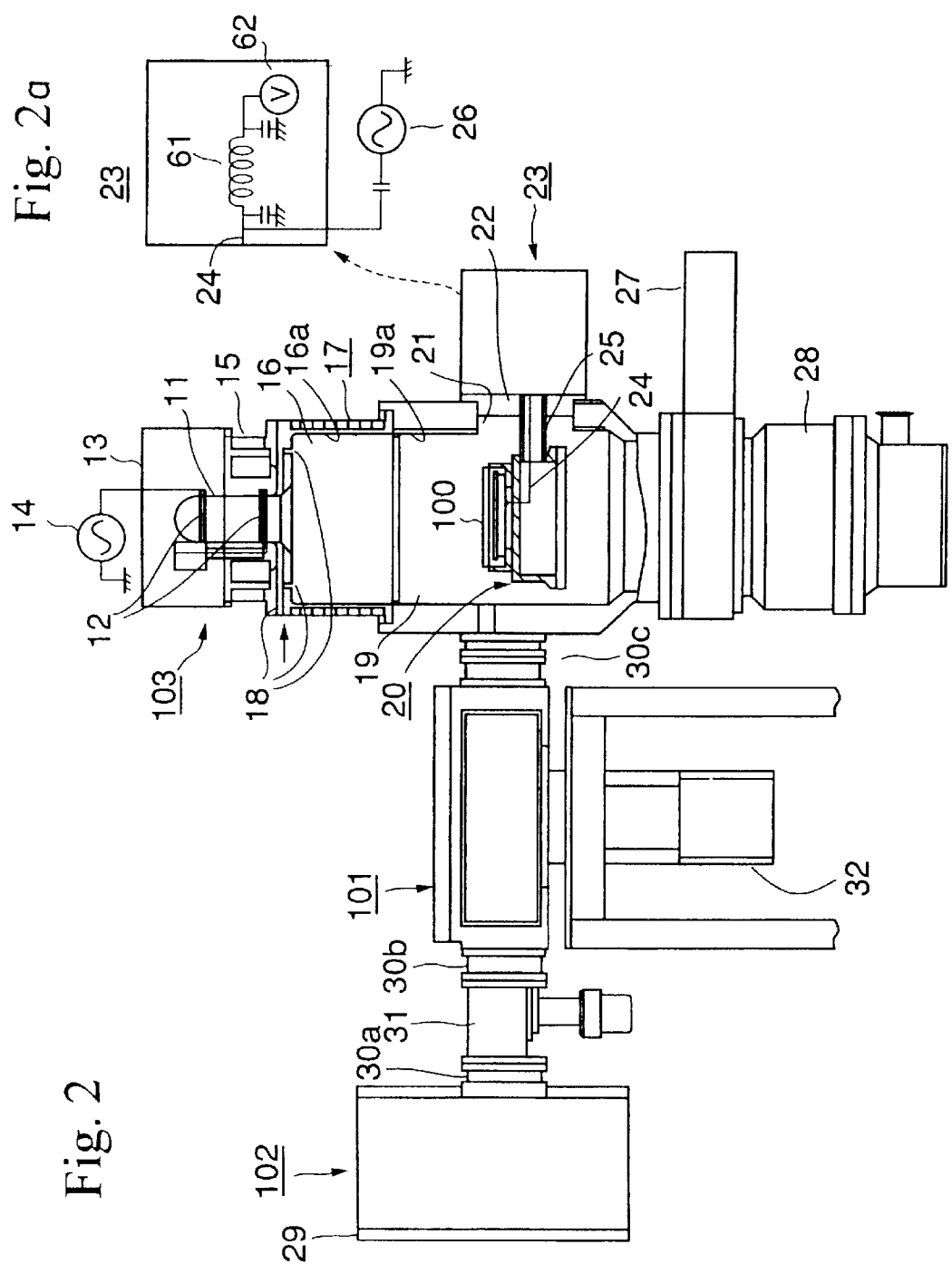
FIG. 2 is a cross-sectional view taken along a line I—I of FIG. 1 and viewed from the direction of the arrow.
Figure 3:
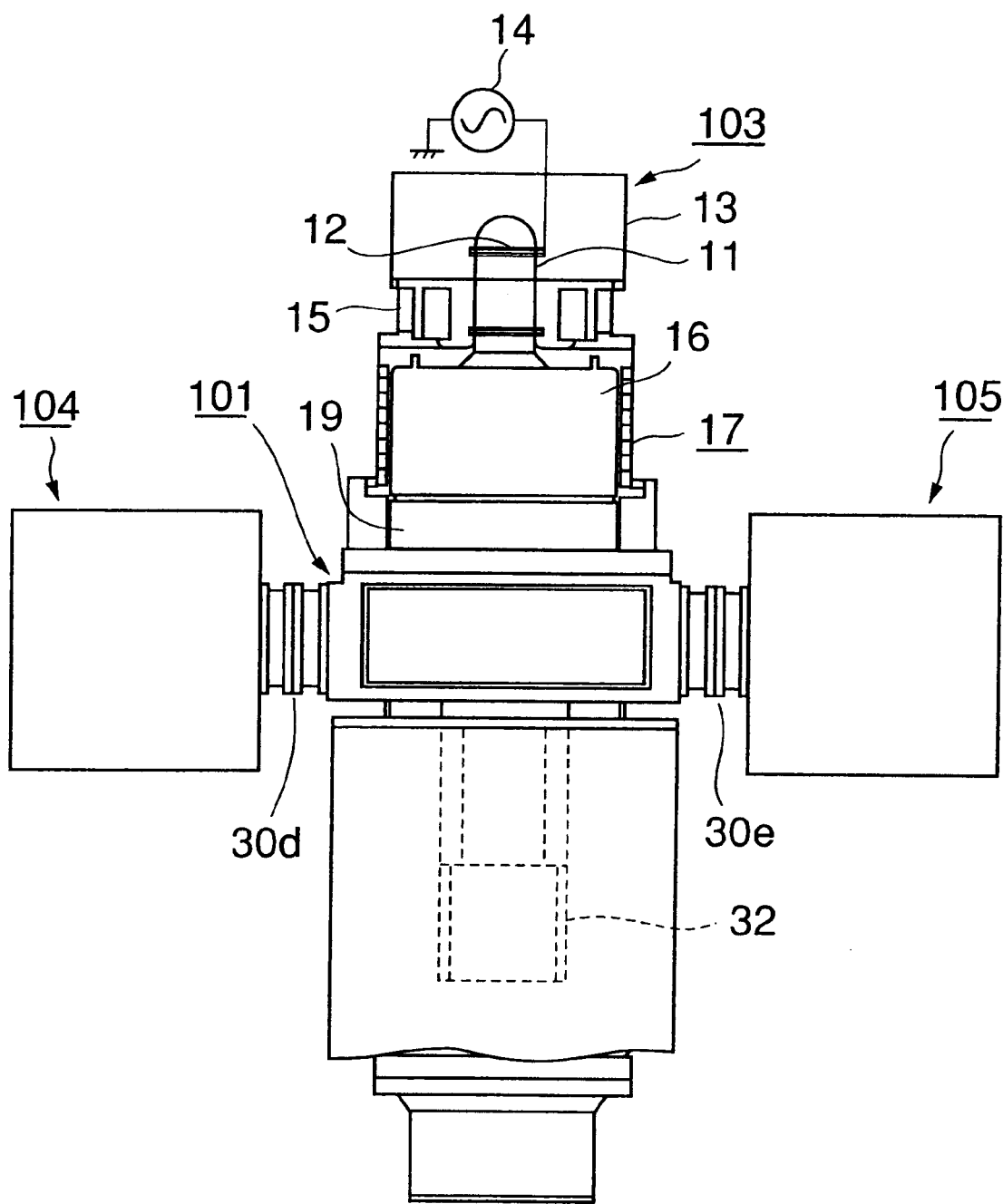
FIG. 3 is a cross-sectional view taken along a line II—II of FIG. 1 and viewed from the direction of the arrow.

As can be seen in FIGS. 1 to 3, the plasma doping system comprises a transfer chamber 101 in the shape of a rectangular box having four side walls, the inner pressure of which can be reduced. And to each of four side walls are separately connected a load-lock chamber 102 whose inner pressure can be reduced, a plasma doping chamber 103 whose inner pressure can be reduced, an ashing chamber (mask removal chamber) 104 whose inner pressure can be reduced, and an annealing chamber 105 whose inner pressure can be reduced.

The load-lock chamber 102 provides the inlet and outlet for the semiconductor substrate 100 to and from the plasma doping system. The plasma doping chamber 103 provides a region for introducing the conduction type impurities into a semiconductor layer. The ashing chamber 104 provides a region for removing a mask (photosensitive etching-proof mask) in the form of a resist film. The annealing chamber 105 provides a region for raising the temperature of the semiconductor substrate 100 to activate the conduction type impurities introduced into the semiconductor substrate 100.

The entrance to the load-lock chamber 102 is provided with a gate valve 29 capable of sealing the interior of the chamber 102 from the exterior. The connection between the transfer chamber 101 and the load-lock chamber 102 is provided with a gate valve 30a, a substrate conveyance path 31 and a gate valve 30b intervening between the load-lock chamber 102 and the transfer chamber 101. The other connections between the transfer chamber 101 and the chambers 103, 104 and 105 are merely provided with gate valves 30c, 30d and 30e, respectively. The opening or closing of the gate valves 30a to 30e enables the chambers 101 to 105 to communicate with one another or to be hermetically sealed from one another.

Exhaust devices are connected individually to the chambers 101 to 105 in order to ensure that the chambers 101 to 105 can separately reduce their respective inner pressures. Referring to FIG. 2, only one exhaust device 28 is visible and is connected to the plasma doping chamber 103.

The load-lock chamber 102 provides the inlet when the semiconductor substrate 100 is loaded from the exterior into the plasma doping system and provides the outlet when it is unloaded from the interior of the plasma doping system to the exterior.

In case the pressure within the chambers 101, 103 to 105 is lower than the atmospheric pressure, the pressure within the load-lock chamber 102 may be reduced upon the loading or unloading of the semiconductor substrate 100 into or from the system whereby the pressure within the load-lock chamber can be adjusted to the pressures within the chambers 101, 103 to 105, or at least to the pressure within the transfer chamber 101.

The ashing chamber 104 is a chamber in which the resist film is removed after the selective introduction of the conduction type impurities into the semiconductor substrate 100 through openings in the resist film acting as the mask. Oxygen plasma is used herein as an ashing gas. Provided therefor are an oxygen gas inlet and means for transforming oxygen gas into plasma.

The annealing chamber 105 is a chamber in which heat treatment is performed for activating the conduction type impurities introduced into the semiconductor substrate 100. The annealing chamber 105 is provided with a heater for heating and a laser irradiation mechanism for a rapid thermal annealer (RTA).

The plasma doping chamber 103 as illustrated in FIG. 2 comprises, in the mentioned order from upstream along the flow of plasma gas a plasma generation chamber 11, a plasma flow passage/shaping chamber 16, an impurity introduction chamber 19 and the exhaust chamber 28. The plasma doping chamber 103 is connected through the impurity introduction chamber 19 to the transfer chamber 101.

Details of the plasma doping chamber 103 will now be described.

The plasma generation chamber 11 is provided with a high-frequency power supply 14 for supplying a high-frequency electric power at 13.56 MHz and with antennas 12 for discharging the high-frequency electric power supplied from the high-frequency power supply 14, the chamber 11 being partitioned from the exterior by a partition wall of a bell jar type. The cylindrical portion of the partition wall has a 95 mm inner diameter.

Between the high-frequency power supply 14 and the antennas 12 is a matching circuit 13 for impedance matching. The high-frequency electric power discharged from the antennas 12 serves to transform an conduction type impurity containing gas within the plasma generation chamber 11 into a helicon plasma. The conduction type impurity containing gas used herein is a gas filling the plasma generation chamber 11 as a result of supply thereof through gas inlets 18 of the plasma flow passage/shaping chamber 16 which will be described later.

The plasma flow passage/shaping chamber 16 is provided with the gas inlets 18 for the gas containing conduction type impurities which impart conduction to the semiconductor substrate and vary the resistivity of the semiconductor substrate. Available as the conduction type impurity containing gas is a diboron gas containing boron which forms a conductive p-type region (hereinafter may be referred to simply as p-type) in silicon and varies the resistivity. Similarly, a gallium hydrogen compound gas or a gallium organometallic compound gas may be used. Alternatively, there may be also used a phosphine gas containing phosphorus which imparts a conductive n-type region (hereinafter. may be referred to simply as n-type) to silicon and varies the resistivity. Similarly, an arsenic hydrogen compound gas or an arsenic organometallic compound gas may be used.

The plasma flow passage/shaping chamber 16 is interposed between the plasma generation chamber 11 and the impurity introduction chamber 19, the chamber 16 providing a flow passage through which helicon plasma is led from the plasma generation chamber 11 into the impurity introduction chamber 19. The interior of the plasma flow passage/shaping chamber 16 is hermetically defined by a cylindrical partition wall having an inner diameter of approx. 350 mm.

High-density plasmas such as the helicon plasma interact strongly with the internal walls of the system, with the result that useful plasmas may somewhat be lost by the interaction. To avoid this, the partition wall of the plasma flow passage/ shaping chamber 16 is provided at its outer periphery with permanent magnets (magnetic field generation means) 17 for generating a cusped magnetic field to restrict the extent of the helicon plasma flowing through the plasma flow passage/ shaping chamber 16 to thereby form its shape. The cusped magnetic field serves to suppress the extent of the helicon plasma flowing through the interior of the plasma flow passage/shaping chamber 16 to complete its shaping.

Figure 5:
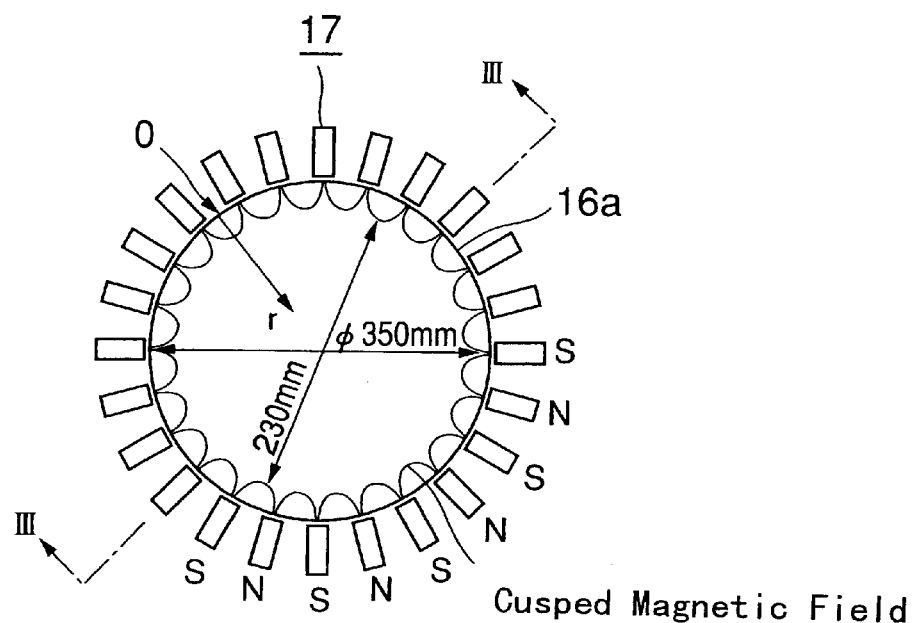
FIG. 5 is a top plan view showing the array of permanent magnets disposed on the outer periphery to a plasma flow passage/shaping chamber of FIG. 1.

Referring to FIG. 2 and particularly to FIG. 5. the arrangement of the permanent magnets 17 is depicted. The permanent magnets 17 are arranged circumferentially around the outer periphery of the partition wall of the plasma flow passage/shaping chamber 16 in such a manner that N-poles and S-poles alternate. Eight circumferential arrays, each consisting of such a series of permanent magnets around the periphery, are arranged one upon another along the length of chamber 16.

As illustrated in FIG. 5, magnetic fields are generated principally between the adjacent permanent magnets 17 and become prevailing in the interior of the plasma flow passage/ shaping chamber 16. Adjustment may be made of the magnetic field strength of each permanent magnet 17 and of the interval between the adjacent N-poles and S-poles so as to delimit the space in which plasma is present depending on the diameter of the semiconductor substrate 100.

Figure 6:
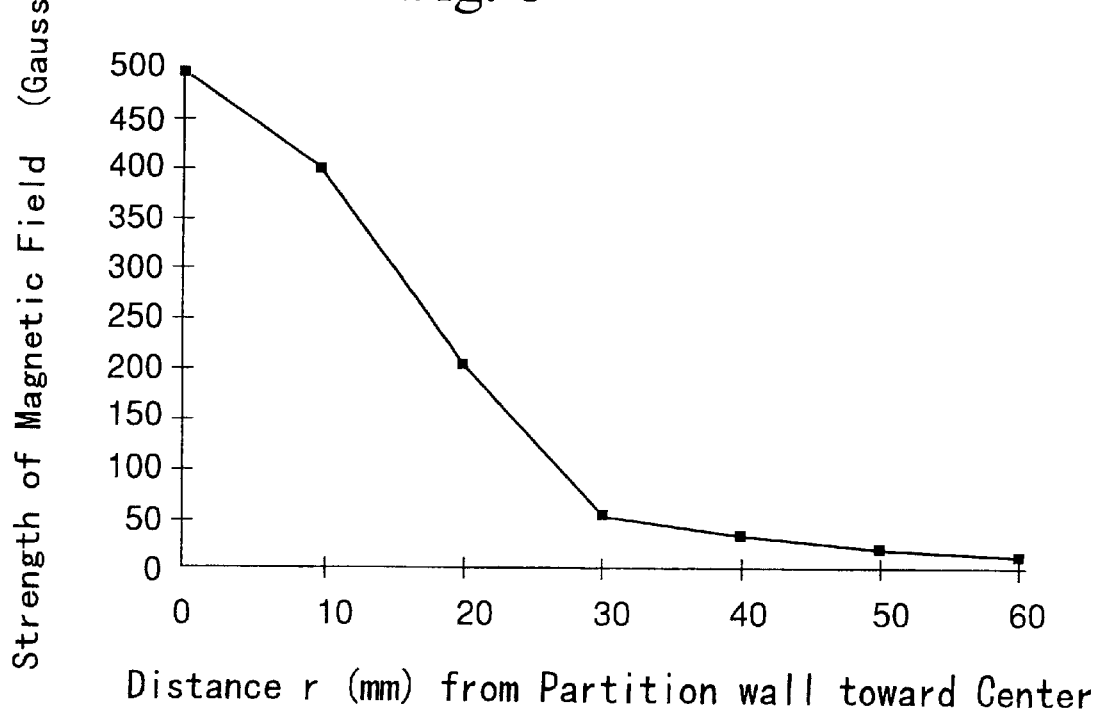
FIG. 6 is a sectional view of the plasma flow passage/shaping chamber of FIG. 1, with a graphic representation of a distribution in section of a magnetic field which is generated within the plasma shaping chamber by the permanent magnets disposed on the outer periphery of the plasma flow passage/shaping chamber.

FIG. 6 illustrates a distribution of the magnetic field strength measured in the radial direction from the inner wall surface of the partition wall of the plasma flow passage/ shaping chamber 16 toward the center of the plasma flow passage/shaping chamber 16. In FIG. 6, the abscissa represents the distance r (mm) from the partition wall toward the center and the ordinate represents the strength of magnetic field (gauss).

As can be seen in the graphic representation of FIG. 6. the strength of the magnetic field becomes substantially null at locations approx. 60 mm or farther from the inner wall surface of the partition wall. Thus, the helicon plasma passing through the plasma flow passage/shaping chamber 16 is present or confined mainly to a diameter of 230 mm and is prevented from spreading outward therefrom. It is thus possible to prevent any dispersion of the plasma and to achieve an enhanced uniformity in the distribution of plasma density, as well as to prevent any possible loss of plasma within the plasma flow passage/shaping chamber 16 and within the impurity introduction chamber 19, thereby improving the efficiency.

Figure 7:
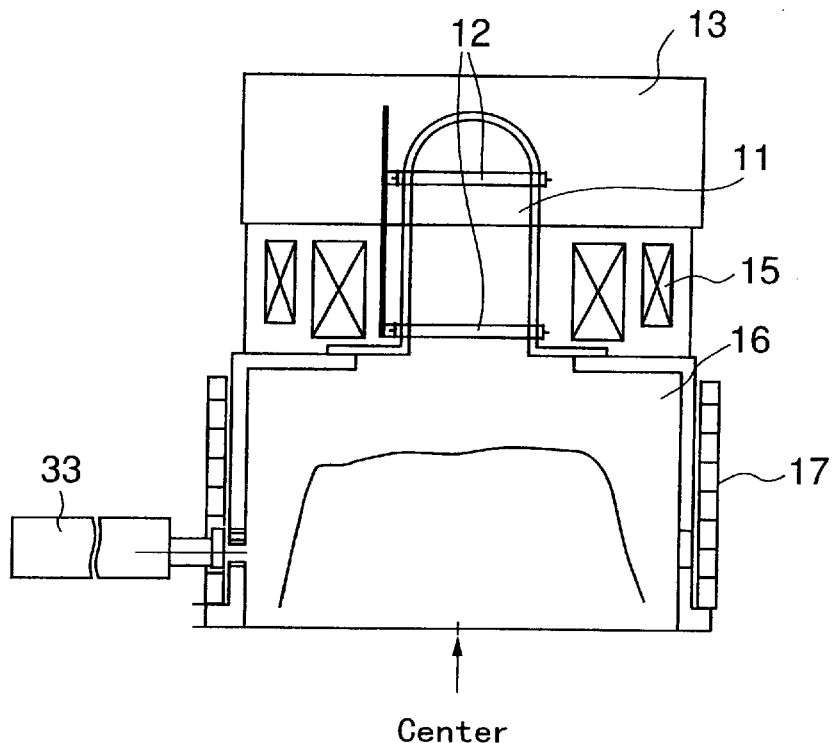
FIG. 7 is a side view schematically showing a distribution of a plasma existing within the plasma flow passage shaping chamber of FIG. 1.
Figure 8:
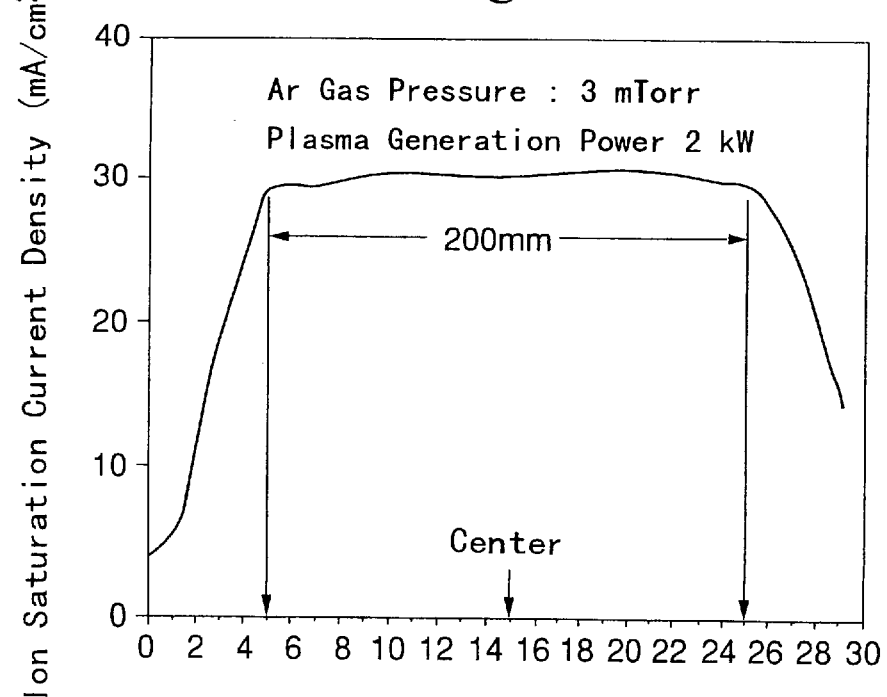
FIG. 8 is a graphic representation of distribution of a plasma existing within the plasma flow passage shaping chamber of FIG. 1.

FIG. 7 is a diagram schematically showing the distribution of plasma density within the plasma flow passage/ shaping chamber 16 and within such a cusped magnetic field. FIG. 8 is a graphic representation showing the result of measurement of the distribution of plasma passing through the interior of the chamber 16 and within the cusped magnetic field. In FIG. 8, the abscissa represents the position (cm) within the chamber 16 and the ordinate represents the ion saturation current density (mA/cm$^2$).

Plasma is generated with an Ar gas pressure of 3 mTorr and a plasma generation power of 2 kW. The ion saturation current density was measured by use of a fast probe 33 manufactured by PMT (Plasma & Materials Incorporation) and disposed on the outside of the partition wall of the plasma flow passage/shaping chamber 16 as shown in FIG. 7. The result of measurement of FIG. 8 shows a highly improved uniformity in the plasma distribution.

Furthermore, in the plasma flow passage/shaping chamber 16, diborane or other gas may possibly adhere to the inner wall surfaces of the partition wall, which would require a cumbersome periodical cleaning of the inner wall surfaces of the partition wall. To avoid this, a quartz protection liner 16a is provided along, the inner wall surfaces of the partition wall. Thus, the conduction type impurities in plasma state will adhere to this protection liner 16a, so that the conduction type impurities are prevented from directly adhering on the inner wall surfaces of the partition wall. The inner surfaces of the protection liner 16a are abraded down to a surface roughness of the order of 10 µm to provide an effective wall surface area as small as possible in order to prevent any adhesion of metal contaminant or degassing.

The impurity introduction chamber 19 is partitioned from the exterior by a tubular partition wall having the same inner diameter as that of the plasma flow passage/shaping chamber 16. The chamber 19 is provided with a substrate holding fixture 20 for retaining the semiconductor substrate 100. Exhaust device 28 is connected via a throttle valve 27 to the impurity introduction chamber 19. This exhaust device 28 serves to reduce the pressure not only within the impurity introduction chamber 19 but also within the plasma flow passage/shaping chamber 16 and the plasma generation chamber 11. This chamber 19 allows helicon plasma of the conduction type impurity containing gas to come into contact with the semiconductor substrate 100, to thereby introduce the conduction type impurities into the semiconductor substrate 100.

Unlike the plasma flow passage/shaping chamber 16, no magnets are disposed around the outer periphery of the partition wall of the impurity introduction chamber 19. A withdrawal port 21a is also provided for impurity introduction chamber 19 for the purpose of cleaning or the like. The draw-out port 21a is usually hermetically sealed by a sealing door 21. This draw-out port 21 is utilized to connect an electric power supply wiring 24 from a bias power supply 23 through the interior of a retaining arm 25 of the substrate holding fixture 20 to a bias applying electrode of the substrate holding fixture 20.

The impurity introduction chamber 19 is also provided with a quartz protection liner 19a covering the inner surfaces of the partition wall in the same manner as the plasma flow passage/shaping chamber 16. An impurity gas in plasma state adheres to the protection liner 19a which prevents any adhesion of the impurity gas to the inner surfaces of the partition wall. Similarly, the inner surfaces of the protection liner 19a are abraded down to a surface roughness on the order of 10 μm in order to prevent any adhesion of metal contaminants or degassing.

The upper and lower protection liners 16a and 19a may be dismounted in order to remove any impurities adhered to the upper protection liner 16a of the plasma flow passage/shaping chamber 16 or to the lower protection liner 19a of the impurity introduction chamber 19, after doping of the semiconductor substrate 100 by use of the plasma doping system described above. In such a case, the lower protection liner 19a is first removed laterally through the impurity introduction chamber 19, and thereafter the upper protection liner 16a is pulled down to the impurity introduction chamber 19 and then similarly removed laterally through the impurity introduction chamber 19.

Figure 4:
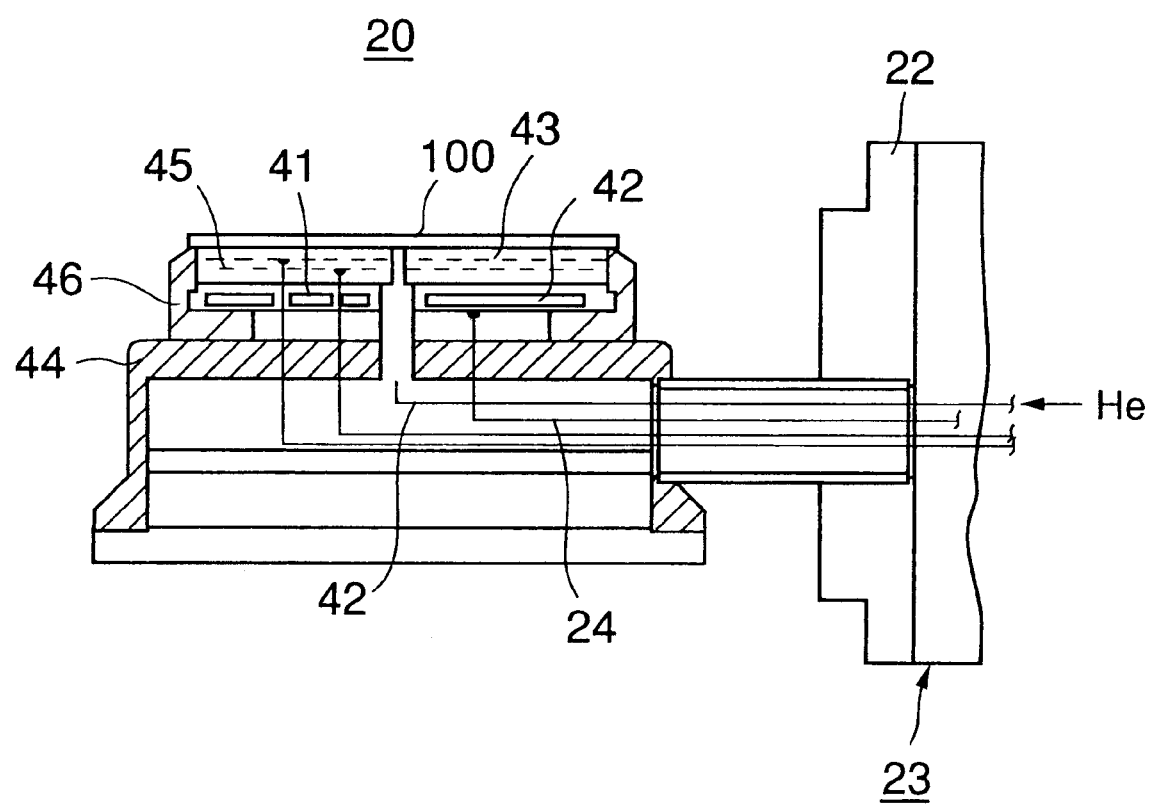
FIG. 4 is a side view showing the configuration of a substrate holding fixture disposed in the plasma doping system in accordance with the embodiment of the present invention.

FIG. 4 shows details of the structure of the substrate holding fixture 20 provided in the impurity introduction chamber 19.

The substrate holding fixture 20 has its outermost part formed from an insulator 46 of alumina. An electrode 43 for electrostatic attraction is embedded so that the semiconductor substrate 100 is electrostatically retained by an electrostatic chuck. A heater is provided for use as heating means (temperature regulation means) 45 below the electrode 43. Below the electrode 43 there is also provided piping 42 through which a coolant, e.g., helium gas, flows, the piping being used as cooling means (temperature regulation means). Reference numeral 44 denotes an electrode for grounding.

In the case where the semiconductor substrate 100 has formed thereon a resist film acting as a mask for selective introduction of conduction type impurities, the semiconductor substrate 100 is cooled by the cooling means 42 in order to prevent any change in quality of the resist film when the temperature of the semiconductor substrate 100 rises as a result of exposure to plasma. In a case where no resist film is used, the semiconductor substrate 100 may be heated by the heating means 45 when the semiconductor substrate 100 and the plasma are in contact with each other, to thereby activate the impurities simultaneously with the introduction of the impurities.

The substrate holding fixture 20 is further provided with a built-in bias applying electrode 41 coupled to an AC power source 26 for supplying AC power at approx. 100 kHz as shown in FIG. 2. The DC or AC power is fed in a continuous or intermittent (pulselike) manner to apply a bias voltage to the semiconductor substrate 100. This gives rise to a potential difference between the plasma and the semiconductor substrate 100 whereupon impurity ions can be accelerated by the resultant electric field so as to be introduced into the semiconductor substrate 100. As a result, a wider range of regulation of the depth of introduction of the impurities becomes possible. In FIG. 2, reference numeral 23 denotes the bias power supply, with the output end of the AC power source 26 being connected via a low-pass filter 61 to a voltage measurement device 62. The output end of the AC power source 26 is connected by the wiring 24 to the electrode 41 of the substrate holding fixture 20.

Although the AC power source 26 is used as the bias power supply source in FIG. 2, the AC power source 26 may be replaced by a DC power source for supplying DC power. In such a case, the voltage measurement device 62 may be directly connected to the output end of the AC power source 26, with omission of the capacitor and the low-pass filter 61 coupled to the output end of the AC power source 26.

Furthermore, the substrate holding fixture 20 may be secured to a rotary shaft perpendicular to the substrate retaining surface so that it can rotate around the shaft. This will contribute to an improved uniformity of distribution of the impurities introduced.

Figure 9A:
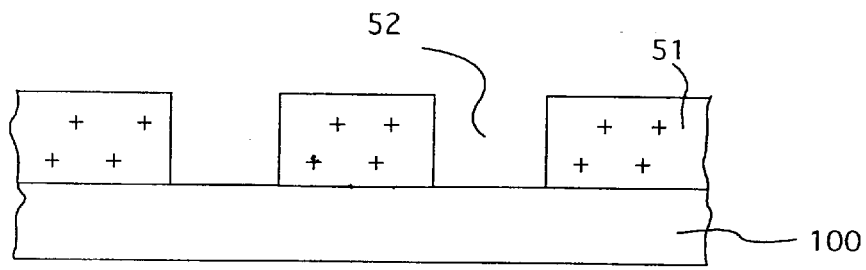
FIGS. 9A to 9D are cross-sectional views showing a plasma doping method using the plasma doping system in accordance with the embodiment of the present invention.

A method of selectively introducing impurities into the semiconductor substrate 100 by use of the above plasma doping system will now be described with reference to FIGS. 9A to 9D. First, as shown in FIG. 9A, a resist film (photosensitive etching-proof film) 51 having openings 52 is formed on the surface of an n-type silicon semiconductor substrate 100. The openings 52 are formed in regions into which impurities are to be introduced. After loading of this semiconductor substrate 100 into the load-lock chamber 102, reduced pressures are established in the transfer chamber 101, load-lock chamber 102, impurity introduction chamber 19, ashing chamber 104 and annealing chamber 105. After a predetermined pressure has been reached, the semiconductor substrate 100 is conveyed from the load lock chamber 102 to the interior of the transfer chamber 101.

The semiconductor substrate 100 is then conveyed from the interior of the transfer chamber 101 into the impurity introduction chamber 19. Subsequently, an conduction type impurity containing gas, e. g., diborane gas containing boron for imparting p-type conductivity to the silicon layer, is fed through the as inlets 18 of the plasma flow passage/shaping chamber 16 into the plasma generation chamber 11. High-frequency power is then supplied from the high-frequency power source 14 and is discharged from the antennas 12. This transforms the conduction type impurity containing gas into a helicon plasma having a plasma density of $10^{18}$ to $10^{19}$ cm$^{-3}$.

The helicon plasma then flows downstream toward the impurity introduction chamber 19. At that time, within the plasma flow passage/shaping chamber 16 there is generated a cusped magnetic field, which restrains diffusion of the helicon plasma, allowing the helicon plasma to flow along the longitudinal axis of the plasma flow passage/shaping chamber 16. Thus, due to the suppression of impingement of plasma on the inner wall surfaces of the partition wall, the loss of the plasma is greatly reduced.

Figure 9B:
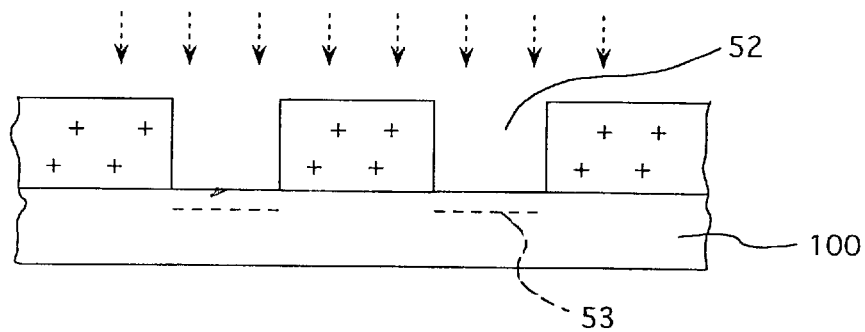
Figure 9C:
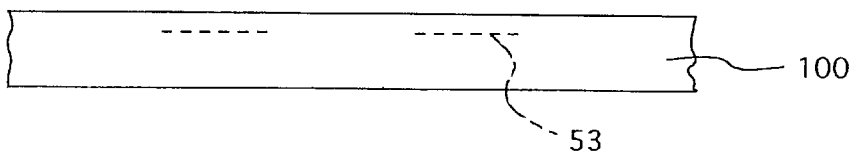
Figure 9D:
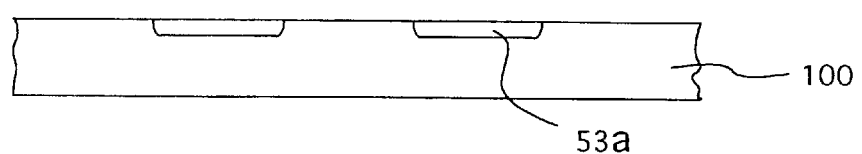

Then, as shown in FIG. 9B, the plasma of the conduction type impurities comes into contact with the semiconductor substrate 100 placed within the impurity introduction chamber 19 so that the conduction type impurities are introduced into the semiconductor substrate 100 to form impurity introduction regions 53 therein. The depth of introduction and the like may be regulated by applying a bias to the substrate holding fixture 20 by use of the AC power source 26 or the DC power source.

The semiconductor substrate 100 is then withdrawn from the impurity introduction chamber 19 and is conveyed to the transfer chamber 101 prior to conveyance to the interior of the ashing chamber 104.

Oxygen gas is then fed into the ashing chamber 104 for transformation into plasma. The resultant oxygen plasma comes into contact with the resist film 51 to chemically etch the latter. After the complete removal of the resist film 51, the semiconductor substrate 100 is withdrawn from the ashing chamber 104 and is conveyed to the annealing chamber 105.

The semiconductor substrate 100 is then heated for ten sec. at 950° C. in an atmosphere of nitrogen, to activate the conduction type impurities which are present within the semiconductor substrate 100. p-type regions 53a are thereby formed to complete the series of steps of the plasma doping.

The semiconductor substrate 100 is thereafter withdrawn from the annealing chamber 105 and is conveyed to the interior of the transfer chamber 101, which in turn is followed by the conveyance from the transfer chamber 101 to the interior of the load-lock chamber 102.

Afterward, the pressure within the load-lock chamber 102 is returned to atmospheric pressure, and then the semiconductor substrate 100 is unloaded from the load-lock chamber 102.

According to the plasma doping system of the embodiment of the present invention as set forth hereinabove, even when the semiconductor substrate (wafer) has an enlarged diameter, there is no need for too large a high-frequency power source 14 due to its frequency as low as 13.56 MHz. The simple structure of the antennas 12 also eliminates need for the antennas of even larger dimensions. Compact permanent magnets 17 can be used as the magnetic field generation means 17 disposed on the plasma flow passage within the plasma flow passage/shaping chamber 16, thereby minimizing size.

It is therefore possible for the doping system using the helicon plasma in accordance with the present invention to reduce the floor area required for the system as compared with the conventional doping system using the ECR plasma.

Furthermore, a single transfer chamber 101 establishes communication among the impurity introduction chamber 19 of the plasma doping chamber 103, the ashing chamber 104 and the annealing chamber 105, whereby a single system can perform a series of process steps related to plasma doping such as introduction of conduction type impurities, removal of the resist mask for the selective introduction of the conduction type impurities and activation of the conduction type impurities.

Individual pieces of apparatus require a working space for the workers in addition to the net floor area for placement of each apparatus. In contrast, this embodiment integrates those apparatuses into a single system as described above, thereby making it possible to reduce the working space. It is therefore possible for the thus integrated plasma doping system to reduce the floor area necessary for the system, as compared with the case of separate items of apparatus.

Although the present invention has been described in detail with reference to a preferred embodiment, it will be appreciated that the scope of present invention is not limited to the above embodiment but, rather, covers all variants of the above embodiment insofar as they do not depart from the split of the present invention.

In the above embodiment, for example, the present invention is a plasma doping system obtained by integrating into a single system the plasma doping chamber 103, the ashing chamber 104 for removing the resist film 51 and the annealing chamber 105 for activating the impurities introduced into the semiconductor substrate 100; however, the present invention could be applied to a system consisting only of the plasma doping chamber 103.

The plasma flow passage/shaping chamber 16 and the impurity introduction chamber 19 have been described as provided with partition walls having inner wall surfaces protected by the quartz liners 16a and 19a, but the protection walls may be made of aluminium or ceramics.

Although the plasma doping system of the present invention has employed the helicon plasma as plasma source, use may be made of ICP (Inductive Coupled Plasma), multi-spiral coil (MSC) ICP, magnetron two-frequency plasma, triode plasma, LEP (Lissajou electron Plasma), etc. All of the above are well known as the plasma sources for etching systems, with the use of high-frequency electric power on the order of 1 to 20 MHz.

Furthermore, the conduction type impurity gas inlets 18 have been described as provided in the plasma flow passage/shaping chamber 16, but alternatively may be provided in the plasma generation chamber 11.

As set forth hereinabove, the plasma doping system of the present invention is provided with the high-frequency power source which supplies high-frequency electric power for generating the helicon plasma of the conduction type impurity containing gas and with the antennas for discharging the high-frequency electric power, whereby it is possible to minimize any increase in dimensions of the high-frequency power source and the antennas, otherwise necessitated by enlarged wafer diameters. It is also possible to minimize any increase in dimensions of the magnetic field generation means provided in the plasma flow passage/shaping chamber acting as the flow passage for the helicon plasma.

As a result, the doping system using the helicon plasma of the present invention is able to reduce the floor area required for the system as compared with the doping system using the ECR plasma.

By virtue of the juxtaposed junction to a single transfer chamber of the plasma introduction chamber, the mask removal chamber and the annealing chamber of the plasma doping system, a single system is capable of performing a series of process steps related to the plasma doping such as introduction of conduction type impurities, the removal of the resist mask for the selective introduction of the conduction type impurities, and the activation of the conduction type impurities. This also achieves a reduction in the floor area required for the system as compared with the case of individual, separate pieces of apparatus.

What is claimed is:

1. A plasma doping method for introducing at least one conduction type impurity into a semiconductor substrate, said method comprising:

feeding a gas containing said conduction type impurity into a plasma generation chamber;

generating a high-frequency electric discharge to produce, within the plasma generation chamber, a helicon plasma of said gas containing said conduction type impurity;

passing said helicon plasma from said plasma generation chamber through a magnetic field to confine said helicon plasma to a predetermined diameter, thereby shaping said helicon plasma; and causing said shaped helicon plasma to come into contact with said semiconductor substrate to thereby introduce said impurity into said semiconductor substrate.

2. A plasma doping method according to claim 1, further comprising:

applying DC power or AC power to said semiconductor substrate so as to generate a bias voltage in said substrate, whereby conduction type impurity ions are accelerated for introduction into said semiconductor substrate by use of the resultant potential difference occurring between said semiconductor substrate and said helicon plasma.

3. A plasma doping method according to claim 1, wherein said semiconductor substrate is cooled or heated upon the introduction of said conduction type impurities into said semiconductor substrate.

4. A plasma doping method for selectively introducing at least one conduction type impurity into a semiconductor substrate having formed thereon a photosensitive etching-proof mask, said method comprising:

conveying said semiconductor substrate in succession, through a load-lock chamber, a transfer chamber and into an impurity introduction chamber;

feeding a gas containing said conduction type impurity into a plasma generation chamber;

generating a high-frequency electric discharge, within the plasma generation chamber, to produce a helicon plasma of said conduction type impurity containing gas;

passing said helicon plasma from said plasma generation chamber through a magnetic field to confine said helicon plasma to a predetermined diameter, thereby shaping said helicon plasma;

causing said shaped helicon plasma to come into contact with said semiconductor substrate, within said impurity introduction chamber, to thereby selectively introduce said impurity into said semiconductor substrate in conformity with said photosensitive etching-proof mask;

conveying said semiconductor substrate from said impurity introduction chamber through said transfer chamber and into a mask removal chamber;

removing said photosensitive etching-proof mask from said semiconductor substrate; and conveying said semiconductor substrate from said mask removal chamber through said transfer chamber into an annealing chamber; and heating said semiconductor substrate, within said annealing chamber, to activate said conduction type impurity introduced into said semiconductor substrate.

5. A plasma doping method according to claim 4, further comprising:

applying DC power or AC power to said semiconductor substrate so as to generate a bias voltage in said substrate, whereby conduction type impurity ions are accelerated for introduction into said semiconductor substrate by use of the resultant potential difference occurring between said semiconductor substrate and said helicon plasma.

6. A plasma doping method according to claim 4, wherein said semiconductor substrate is cooled or heated upon the introduction of said conduction type impurities into said semiconductor substrate.

7. A plasma doping method according, to claim 1 wherein said magnetic field is cusped and surrounds a flow path through which said helicon plasma passes en route from the plasma generation chamber to the semiconductor substrate.

8. A plasma doping method according to claim 4 wherein said magnetic field is cusped and surrounds a flow path through which said helicon plasma passes en route from the plasma generation chamber to the semiconductor substrate.

9. A plasma doping method according to claim 7 wherein said magnetic field is formed by permanent magnets arranged in a series of rings around said flow path, the magnetic magnets within each ring presenting alternating north and south poles facing said flow path.

10. A plasma doping method according to claim 8 wherein said magnetic field is formed by permanent magnets arranged in a series of rings around said flow path, the magnetic magnets within each ring presenting alternating north and south poles facing said flow path.

11. A plasma doping method according to claim 1 wherein said magnetic field spaces said helicon plasma from wall surfaces of a chamber through which said helicon plasma passes en route from the plasma generation chamber to the semiconductor substrate.

12. A plasma doping method according to claim 4 wherein said magnetic field spaces said helicon plasma from wall surfaces of a chamber through which said helicon plasma passes en route from the plasma generation chamber to the semiconductor substrate.

* * * * *